(12) United States Patent
Brumfield et al.

(10) Patent No.: US 8,090,480 B2
(45) Date of Patent: Jan. 3, 2012

(54) CONSUMER ELECTRONIC USAGE MONITORING AND MANAGEMENT

(75) Inventors: Sara Carlstead Brumfield, Austin, TX (US); Xiaoping Chen, Austin, TX (US); Tara Leigh Marshburn, Austin, TX (US); Sandra Lee Tipton, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 12/349,566

(22) Filed: Jan. 7, 2009

(65) Prior Publication Data

US 2010/0174419 A1    Jul. 8, 2010

(51) Int. Cl.
| | |
|---|---|
| *G05D 3/12* | (2006.01) |
| *G05D 5/00* | (2006.01) |
| *G05D 9/00* | (2006.01) |
| *G05D 11/00* | (2006.01) |
| *G05D 17/00* | (2006.01) |
| *G01R 21/06* | (2006.01) |
| *G05B 23/02* | (2006.01) |
| *G05B 19/00* | (2006.01) |
| *G08B 1/08* | (2006.01) |
| *G08B 29/00* | (2006.01) |
| *G06F 7/04* | (2006.01) |
| *G08C 19/00* | (2006.01) |
| *H04B 1/00* | (2006.01) |
| *H04B 3/00* | (2006.01) |
| *H04Q 1/00* | (2006.01) |
| *H04Q 9/00* | (2006.01) |

(52) U.S. Cl. .......... 700/296; 700/291; 700/298; 702/60; 340/3.1; 340/5.8; 340/539.14

(58) Field of Classification Search .................. 340/3.1, 340/5.1, 5.8, 310.11, 310.16, 531, 533, 538, 340/539.1, 539.14, 539.22, 825.22; 700/286, 700/291, 295–298; 702/1, 57, 60
See application file for complete search history.

(56) References Cited

U.S. PATENT DOCUMENTS

| | | | |
|---|---|---|---|
| 4,415,853 A | | 11/1983 | Fisher |
| 4,630,211 A | | 12/1986 | Pettis |
| 4,644,320 A | | 2/1987 | Carr et al. |
| 5,436,510 A | | 7/1995 | Gilbert |
| 5,544,036 A | | 8/1996 | Brown, Jr. et al. |
| 6,088,659 A | | 7/2000 | Kelley et al. |
| 6,631,309 B2 | * | 10/2003 | Boies et al. .................. 700/291 |
| 6,906,617 B1 | * | 6/2005 | Van der Meulen ........... 340/538 |
| 6,993,417 B2 | | 1/2006 | Osann, Jr. |
| 7,821,161 B2 | * | 10/2010 | Beckman ...................... 307/126 |

(Continued)

*Primary Examiner* — Crystal J Barnes-Bullock
(74) *Attorney, Agent, or Firm* — Yee & Associates, P.C.; Jeffrey S. LaBaw

(57) ABSTRACT

A mechanism for managing energy consumption of electrical devices within a home or building. Energy usage data is collected for a first electrical outlet connected to an unidentified electrical device in a facility. A pattern of energy usage is determined from the energy usage data collected at the first electrical outlet. The pattern of energy usage of the first electrical outlet is then compared against known patterns of energy usage for one or more other electrical outlets. Responsive to identifying a match between the pattern of energy usage of the energy usage data collected at the first electrical outlet and a known pattern of energy usage of a second electrical outlet in the one or more other electrical outlets, the electrical device connected to the first electrical outlet is identified as the same electrical device that is associated with the known pattern of energy usage of the second electrical outlet.

20 Claims, 4 Drawing Sheets

U.S. PATENT DOCUMENTS

| | | | |
|---|---|---|---|
| 7,999,415 B2 * | 8/2011 | Beckman | 307/126 |
| 2003/0050737 A1 | 3/2003 | Osann, Jr. | |
| 2006/0132302 A1 * | 6/2006 | Stilp | 340/539.22 |
| 2008/0306985 A1 * | 12/2008 | Murray et al. | 707/102 |
| 2009/0195349 A1 * | 8/2009 | Frader-Thompson et al. | 340/3.1 |
| 2010/0005331 A1 * | 1/2010 | Somasundaram et al. | 713/340 |
| 2010/0145542 A1 * | 6/2010 | Chapel et al. | 700/295 |
| 2010/0191487 A1 * | 7/2010 | Rada et al. | 702/60 |

* cited by examiner

CONSUMER ELECTRONIC USAGE MONITORING AND MANAGEMENT

BACKGROUND OF THE INVENTION

1. Field of the Invention

The present invention relates generally to managing energy usage within a facility, and more specifically to monitoring, controlling, and reporting energy consumption of electrical devices within a home or building.

2. Description of the Related Art

The high cost of electrical energy today creates the need for energy consumers to be able to monitor and analyze the energy usage of electrical devices and reduce the amount of energy consumption within a facility. The term "facility" is construed as any self-contained or multi-occupancy premises for private, public, or professional use. The term "electrical devices" is construed as any device that is plugged into electrical outlets in the facility and draws power from the electrical system of the facility. The term "electrical device" may be used interchangeably with the term "appliance".

Prior art patents related to the subject matter of the illustrative embodiments include U.S. Pat. No. 6,993,417B2 which discloses a system in which energy-related information is gathered at electrical junction boxes in a facility. The information is visually displayed and communicated to a centrally located intelligent device, where the information is then monitored, and analyzed, and used for energy-related control functions. U.S. Published Patent Application No. 20030050737A1 also discloses a system that gathers energy-related information (electrical and thermal) at electrical junction boxes and displays the information at the point of energy use or measurement. The information is also communicated to a centrally located intelligent device for monitoring, analyzing, and used for energy-related control functions.

BRIEF SUMMARY OF THE INVENTION

The illustrative embodiments provide a mechanism for managing energy consumption of electrical devices within a home or building. The illustrative embodiments collect energy usage data for a first electrical outlet in a facility. The first electrical outlet is connected to an unidentified electrical device. A pattern of energy usage is determined from the energy usage data collected at the first electrical outlet. The pattern of energy usage of the first electrical outlet is then compared against known patterns of energy usage for one or more other electrical outlets. Responsive to identifying a match between the pattern of energy usage of the energy usage data collected at the first electrical outlet and a known pattern of energy usage of a second electrical outlet in the one or more other electrical outlets, the illustrative embodiments allow for identifying the electrical device connected to the first electrical outlet as the same electrical device that is associated with the known pattern of energy usage of the second electrical outlet.

DETAILED DESCRIPTION OF THE INVENTION

Figure 1:
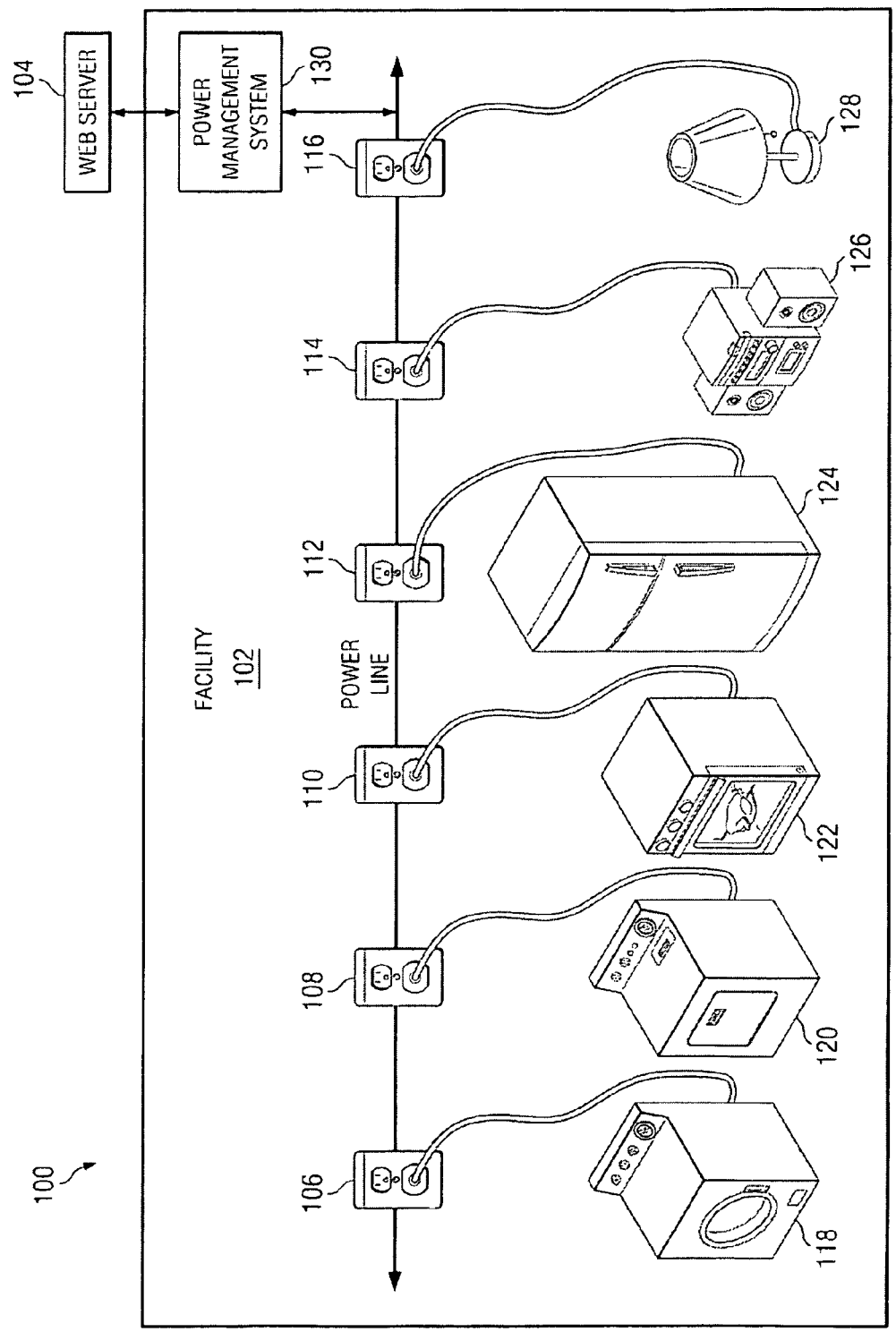
FIG. 1 is a pictorial representation of an energy management environment in which illustrative embodiments may be implemented.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The illustrative embodiments provide an energy management system for controlling the amount of energy used in a facility, such as in a home or building. The illustrative embodiments monitor and track the energy consumption of a home or building on a per outlet basis. The illustrative embodiments autonomically identify an appliance connected to an outlet based on the energy usage of the outlet and control the power supplied to the consuming outlet within the facility. With the illustrative embodiments, residential consumers and business facilities staff may implement energy conservation measures to reduce the energy consumption costs of the electrical devices within a facility.

To manage the energy consumption of electrical devices in a facility, the energy management system monitors the electrical outlets in a facility and measures the energy usage of each outlet. The monitoring and measuring of energy usage on a per outlet basis is known in the art. In one embodiment, a monitoring agent is placed at each outlet to measure the energy consumed at the outlet. If the facility comprises X10-enabled outlets or other similar technology that allows the outlets to be addressable, the energy management system may autonomically discover and configure each outlet in the facility to be monitored as part of the energy management environment.

Using the measured energy usages of the outlets, the energy management system then creates a baseline energy usage profile for each outlet. A baseline energy usage profile reflects the energy usage patterns for an outlet. The energy management system uses the baseline energy usage profile (usage patterns) to determine the current state of the outlet and to identify the electrical device plugged into the outlet based on the state of the outlet. The energy management system identifies the electrical device connected to an outlet by comparing and matching the baseline energy usage profile for an individual outlet to historical or known energy usage data of electrical devices previously collected by the energy management system and/or known historical energy usage data collected by other monitored facilities and stored in an central repository accessible to the energy management system. The historical energy usage data includes known energy usage patterns of an electrical device. Based on the comparison against the historical energy usage data, the energy management system determines the likely electrical device that is plugged into the outlet. As the energy management system identities the likely appliance plugged into a given outlet, the consumer is not required to configure or specify electrical devices connected to the individual outlets. Energy usage patterns of an outlet may include, but are not limited to, the quantity of energy consumed by the electrical device plugged into the outlet, the power or rate at which the energy is consumed by the electrical device plugged into the outlet, the length of time the electrical device draws energy from the outlet, the times of day the electrical device draws energy from the outlet, among others. For instance, if an outlet draws a certain amount of energy each day between 7 and 8 o'clock in the evening, the energy usage management system may identify the electrical device plugged into an outlet as likely to be a dishwasher. Similarly, if an outlet draws a certain amount of energy only for a short amount of time during the early morning hours, the energy usage management system may identify the electrical device plugged into the outlet as likely to be a hairdryer.

Once an electrical device has been identified by the energy management system, the system establishes energy usage thresholds for the outlet connected to the electrical device. The energy usage thresholds (e.g., "active use" or "passive use") are configured by the energy management system and are used to determine what action to take if the energy usage of an outlet exceeds an energy usage threshold. The active use threshold is a configurable threshold set at an expected high energy usage level for an appliance, such as when the appliance is turned on or in use. If the energy usage of an outlet meets or exceeds the active use threshold, the energy management system may determine that the outlet is drawing too much energy and the outlet should be disabled. The passive use threshold is a configurable threshold set at an expected low energy usage level for the appliance, such as when the appliance is idle or not in use, but still drawing power from the outlet. If the energy usage of an outlet meets or exceeds the passive use threshold, the energy management system may also determine that the outlet is drawing too much energy and the outlet should be disabled. For instance, if the passive use threshold is set to 0 for a non-critical appliance, the non-critical appliance will meet the passive use threshold when the appliance is drawing power in an idle state, and the appliance will always be disabled.

The results of the threshold comparison for a device and the device identification are used by the energy management system to make energy conservation decisions at the outlet. For example, if the electrical device is identified as a critical appliance (e.g., refrigerator) in active use (i.e., energy usage is above a certain threshold the the outlet), the energy management system concludes that this device is not subject to energy conservation. Thus, the energy usage management system does not alter the power supplied to the refrigerator's outlet. In contrast, if an outlet is connected to a non-critical appliance and is in passive use (i.e., energy usage is at or near the idle baseline), the energy management system may disable this outlet temporarily in order to conserve energy at the facility.

The energy management system may also send the energy usage data to a web server. The energy usage data may comprise data at the outlet level, at an appliance group level, and/or at the facility level. The web server hosts a community web site comprising historical energy usage information from a plurality of participating facilities. The energy management system may view and utilize the historical energy usage information at the web server to assist in the identification of the electrical devices used within a facility. The community web site allows consumers to view and compare their energy usage to the aggregated data of consumers of similar facilities or in similar areas. Comparable facilities may be selected based on facility location, age of facility, number of occupants, etc.

Turning now to FIG. 1, a pictorial representation of an energy management environment in Which illustrative embodiments may be implemented is shown. In this illustrative embodiment, energy management environment 100 comprises a physical facility 102 and a web server 104. Facility 102 is a home or building that comprises a network of A/C electrical outlets 106-116, and disconnectable electrical devices 118-128 plugged into the outlets. In this example, electrical devices include washer 118, dryer 120, oven 122, refrigerator 124, stereo 126, and lamp 128. Facility 102 also comprises a power management system 130 for managing the energy usage of electrical outlets 106-116. Energy management environment 100 may include additional outlets and devices not shown.

Power management system 130 comprises an monitoring capability that measures and collects energy usage data of an outlet over a period of time, an analyzing capability for analyzing the collected energy usage data and identifying the electrical device based on the collected data, a control capability for managing the power provided to the outlet based on the electrical device identification, and a reporting capability for generating reports that inform the consumer as to the effectiveness of the energy conservation efforts. Power management system 130 may utilize existing energy management technology for measuring the electrical usage of an electrical device on a per outlet basis. An example of this existing technology includes placing monitoring agents at electrical outlets 106-116 and instructing the monitoring agents to track and collect current energy usage data about individual outlets in the facility. Power management system 130 may obtain current energy usage data from the monitoring agents periodically (e.g., at predetermined intervals) or on a continuous basis. Monitoring agents may utilize any known monitoring technology for measuring the electrical usage of an electrical device on an individual outlet basis. In addition, for ease of consumer implementation, outlets 106-116 may be X10-enabled outlets or other similar technology, which enables power management system 130 to automatically discover and configure the X10-enabled outlets as part of the energy management system without requiring the consumer to manually configure/register the outlets.

Power management system 130 analyzes the energy usage data collected from the monitoring agents for each individual outlet in facility 102. Power management system 130 establishes a baseline energy usage profile for each individual outlet. Power management system 130 compares the baseline energy usage profile for an outlet against historical energy usage data. The historical energy usage data comprises historical energy usages of outlets previously collected by power management system 130 and/or historical energy usage data of other facilities and obtained from web server 104. The baseline energy usage profile comprising energy usage patterns of an outlet are compared and matched against historical energy usage data. A match to a baseline energy usage profile may comprise equivalent historical energy usage data or substantially similar historical energy usage data. Based on the energy usage comparison, power management system 130 identifies the electrical device that is likely plugged into the outlet. Identifying an electrical device may include identifying the electrical device as a particular appliance (e.g., washer), identifying the electrical device as belonging to a group of appliances (e.g., small kitchen appliances—blender, coffee maker, etc.), or identifying the electrical device as belonging to a particular energy management priority group (e.g., critical appliance, non-critical appliance, etc.) based on the measured energy usage patterns, or any combination of the above.

Power management system 130 also creates energy usage thresholds for each outlet based on the energy usage of the electrical device plugged into the outlet. Power management system 130 automatically creates an active use threshold and a passive use threshold for an outlet based on energy usage patterns measured by the monitoring agents. Alternatively, these thresholds may be created based on statistical threshold information stored at web server 104, such as the mean of the active and passive thresholds set for comparable electrical devices in other facilities. If the energy usage for the outlet meets or exceeds the active use (high energy usage) threshold set for the outlet, the outlet is in active use, and if the energy usage meets or exceeds the passive use (low energy usage) threshold set for the outlet, the outlet is in passive use. The energy consumer may configure, change, add, and delete these thresholds created by power management system 130.

Power management system 130 may also generate reports for the consumer. These reports may specify energy usages of the facility on a per outlet basis, on an appliance basis, by appliance category or type basis, or for the entire facility. The reports may include data indicating energy usage trends over time, such as, for example, by time of day or season. The energy usage trends in the reports inform a consumer as to if an energy conservation effort that was initiated has been successful at the facility level, at the appliance or outlet group level, and at the individual appliance or outlet level. Thus, a consumer may use the reports to identify root causes of excessive energy usage within the facility. The reports may also include reconciliation information that indicates which outlets are currently being monitored by the power manager and which outlets are not being monitored.

Power management system 130 manages the energy supplied to outlets 106-116 in facility 102 based on if energy usage of an outlet has met or exceeded an associated active or passive threshold level. Once the energy usage of individual outlet meets or exceeds the threshold, power management system 130 will initiate an action based on the particular threshold exceeded. For example, when power management system 130 determines that outlet 106 connected to washer 118 switches from active use to passive use, power management system 130 will disable or eliminate the energy supplied to the outlet to conserve energy. Similarly, power management system 130 may employ policies to define when an outlet should be disabled. Policies may limit energy consumption at a facility based on the area or square footage of the facility, the time of day, the particular electrical device connected to the outlet, or other energy usage pattern criteria. For instance, an energy usage policy may specify that only those outlets located in particular areas of the facility will be disabled if the outlets meet or exceed their respective passive use thresholds, while no change is made to outlets located in other areas of the facility. A policy may also specify an outlet will be disabled based on the time of day, such as doing peak energy usage hours when utility companies charge higher rates for these peak energy time windows. In this situation, if the outlet meets or exceeds the passive use threshold assigned to the outlet, the outlet will be disabled only during these peak energy usage hours. For example, during the summer months, teenage children often leave their video game consoles and televisions on in their rooms all day while their parents are away at work. By disabling the outlets connected to these appliances in a certain area of the house (e.g., the children's rooms) and/or during a certain time of day, energy used by the facility may be conserved while also limiting the amount of video games the children can play throughout the day. It should be noted that when implementing the policies, power management system 130 also takes into account the identification of the electrical device drawing power that meets or exceeds a threshold. Consequently, power management system 130 will not disable an appliance connected to the outlet that is identified as critical in nature. In other words, power management system 130 will not disable critical appliances such as refrigerators or medical devices that require a continuous supply of energy to operate properly, but will disable other non-critical devices not in active use, such as a television set.

The actions that may be performed by power management system 130 in response to detecting a threshold violation include, but are not limited to, sending a notification to the consumer, disabling the outlet by eliminating the energy supply available to the outlet, and/or logging the threshold violation event to memory. A disabled outlet may be re-enabled automatically by power management system 130 upon expiration of a time period (e.g., during non-peak usage hours) or manually by the consumer at the power management system or at the outlet. Disabled outlets may also be re-enabled automatically by power management system 130 when all of the monitored devices in the facility are operating within an aggregate usage threshold. The aggregate usage is a sum of the energy usage of a defined group of the outlets in the facility. An aggregate usage threshold defines a maximum energy usage allowable for the defined group of outlets in the facility. In one embodiment, aggregate thresholds may be set for the entire facility in order to manage the monthly energy costs. When the aggregate usage threshold is met or exceeded, power management system 130 identifies target outlets to disable. The consumer may configure the enable/disable policy to specify the priority of enabling/disabling outlets as desired. Thus, controlling energy usage through aggregate usage thresholds ensures that monthly energy use targets may be achieved.

Web server 104 comprises a community comparative energy web site that is accessible to power management system 130 via an Internet communications link. The web site comprises historical energy usage information for participating facilities that may be shared with and viewed by other consumers. Power management system 130 may automatically contribute the energy usage data it has collected to the web site on a one time or on a recurring basis. The energy usage data may comprise usage patterns collected at various levels, including energy usage data for the entire facility, for particular areas of the facility, or for individual outlets in the facility. The energy usage data may include usage patterns for particular appliances that enable other facilities to also compare and identify their appliances as needed.

Consumers may view and compare the historical energy usage information in the web site to their own energy usage. For instance, a consumer may want to determine how the energy usage of his house compares to others' houses in the same or nearby zip code or street. The consumer may also want to know how the energy usage of his house compares to other houses with similar square footage or a swimming pool. The historical energy usage data may also be used to project energy consumption at an outlet if aspects of the physical facility change. For example, a projected energy consumption may be established to determine the impact of adding a new appliance to the facility. Similarly, the historical energy usage data allows consumers to make home improvement decisions regarding energy consumption. For example, a consumer may compare the energy usage of an air conditioning unit against other similar houses in the same neighborhood and gauge the energy benefit of installing energy efficient glass windows.

It should be noted that the consumer may also provide energy usage information and facility information to the community web site as desired. Although the consumer may enter additional information such as facility area (e.g., zip code, street, address, etc), square footage, energy efficient windows, number of stories, type of insulation, number of residents, and ages of the residents, this information is not required by the energy management system.

Figure 2:
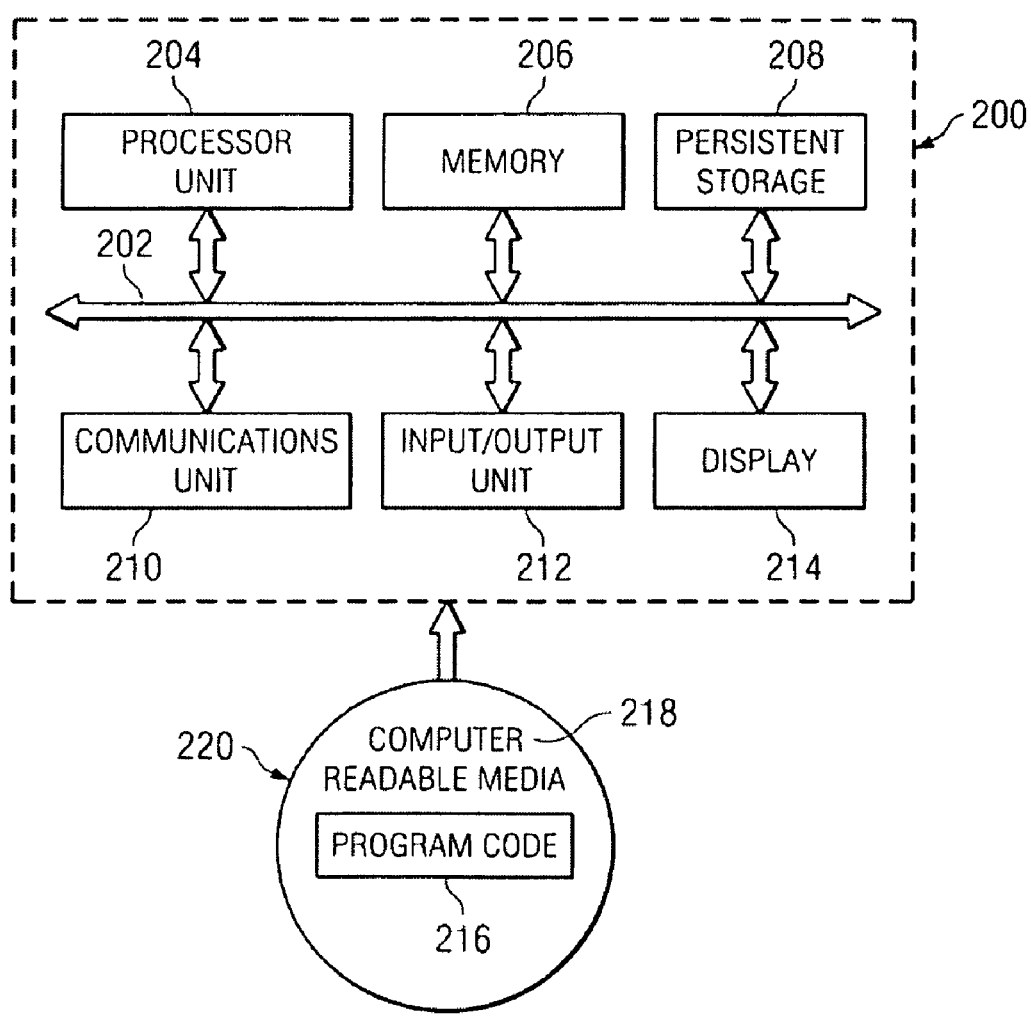
FIG. 2 is a block diagram of a power management device with which aspects of the illustrative embodiments may be implemented.

FIG. 2 is a block diagram of a data processing system with which aspects of the illustrative embodiments may be implemented. Data processing system 200 is an example of power management system 131) and web server 104 in FIG. 1. In this illustrative example, data processing system 200 includes communications fabric 202, which provides communications between processor unit 204, memory 206, persistent storage 208, communications unit 210, input/output (110) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse.

Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer readable media 218 form computer program product 220 in these examples. In one example, computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer readable media 2.18 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples. The computer readable media also may take the form of non-tangible media, such as communications links or wireless transmissions containing the program code.

In some illustrative embodiments, program code 216 may be downloaded over a network to persistent storage 208 from another device or data processing system for use within data processing system 200. For instance, program code stored in a computer readable storage medium in a server data processing system may be downloaded over a network from the server to data processing system 200. The data processing system providing program code 216 may be a server computer, a client computer, or some other device capable of storing and transmitting program code 216.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 200 is any hardware apparatus that may store data. Memory 206, persistent storage 208 and computer readable media 218 are examples of storage devices in a tangible form. In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

Figure 3:
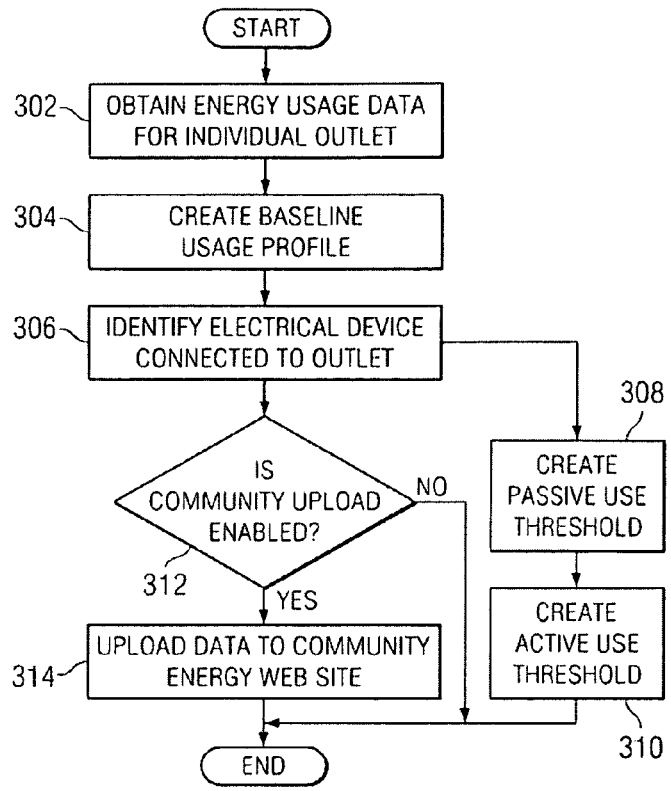
FIG. 3 is a flowchart of a process for creating an energy usage profile for individual outlets in a facility in accordance with the illustrative embodiments.

FIG. 3 is a flowchart of a process for creating an energy usage profile for individual outlets in a facility in accordance with the illustrative embodiments. The process described in FIG. 3 may be implemented in a data processing system, such as power management system 130 in FIG. 1. The process begins with the power management system obtaining energy usage data about individual outlets in a facility (step 302). The energy usage data may comprise energy usage data tracked by monitoring agents placed within the facility and collected on an individual outlet basis.

Upon obtaining the energy usage data for the individual outlets in the facility, the power management system creates a baseline energy usage profile for each individual outlet (step 304). The power management system then identifies the electrical devices connected to each individual outlet (step 306). The power management system may identify the electrical devices by comparing, and matching the baseline energy usage profile for an individual outlet to the historical energy usage data previously collected by the power management system and/or historical energy usage data obtained from other facilities through the community energy web site, and determining the likely electrical device that is plugged into the outlet based on the measured energy usage patterns. For instance, the current energy usage pattern may be compared against known energy usage patterns. If a match of a known energy usage pattern is found, the known electrical device associated with the known energy usage pattern at another outlet may be used by the power management system to identify the unidentified electrical device currently plugged into the outlet. Thus, the power management system may identify the electrical device plugged into the outlet as the same device that is associated with the known (and matching) energy usage pattern of another outlet.

Once the electrical device has been identified, in one path of the process, the power management system creates a passive use threshold for the individual outlet based on the energy usage measured at the outlet and the identification of the electrical device plugged into the outlet (step 308). The power management system also creates an active use threshold for the individual outlet based on the energy usage measured at the outlet and the identification of the electrical device plugged into the outlet (step 310), with the process terminating thereafter.

In a second path of the process, once the electrical device has been identified, the power management system may automatically contribute the energy usage data collected by the monitoring agents and the electrical device identification to a collective energy web site on web server 104 in FIG. 1. The energy usage data may comprise data for the entire facility, for particular areas of the facility, for individual outlets, or for individual appliances in the facility. To contribute data to the collective web site, the power management system first makes a determination that the upload feature of the community web site is enabled (step 312). If the upload feature is not enabled ('no' output of step 312), the process terminates thereafter. However, if the upload feature is enabled ('yes' output of step 312), the power management system uploads the collected energy usage data to the community web site at the web server (step 314). This energy usage data may then be viewed and shared with other consumers in participating facilities through the web site.

Figure 4:
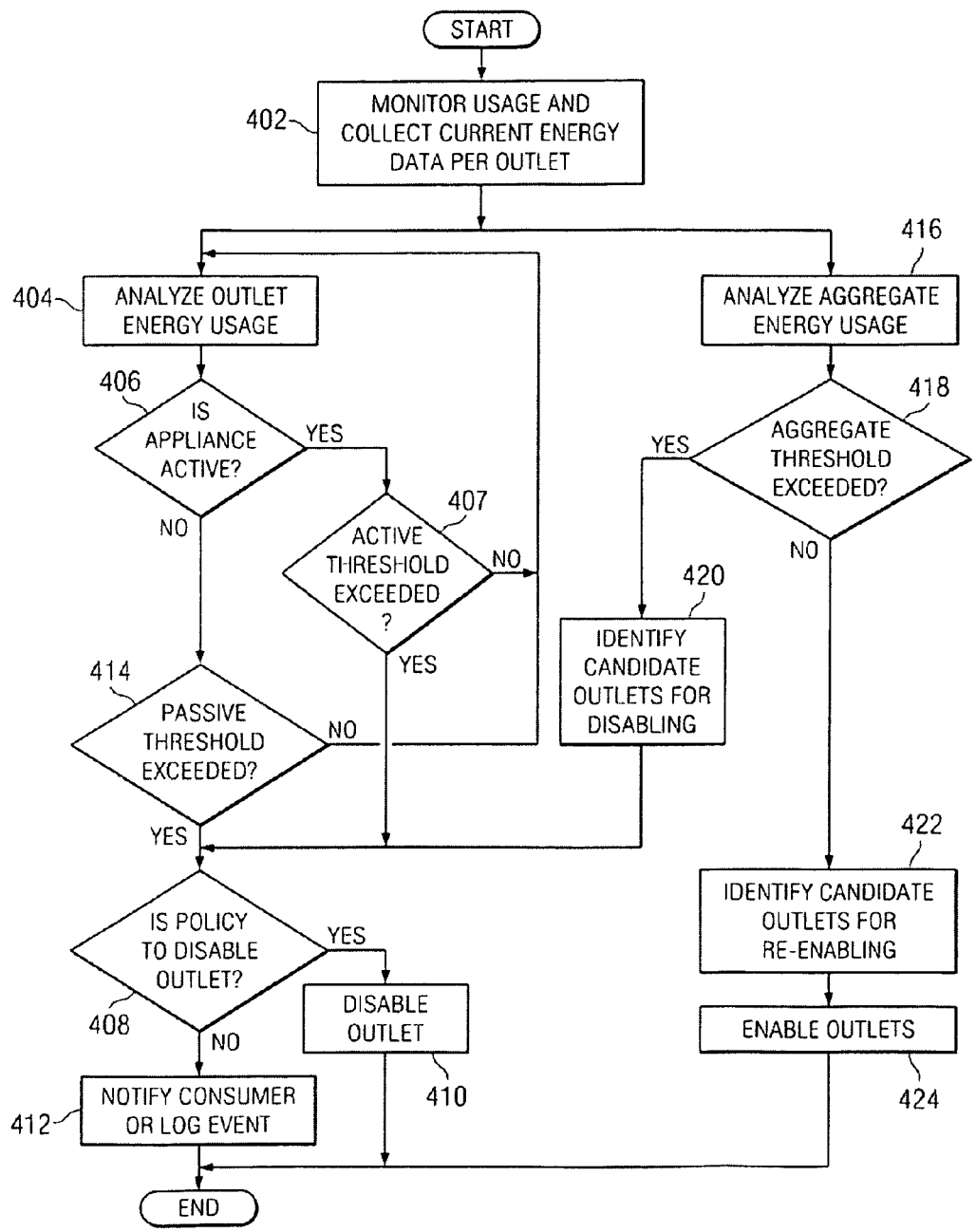
FIG. 4 is a flowchart of a process for monitoring and managing the energy usage of the facility in accordance with the illustrative embodiments.

FIG. 4 is a flowchart of a process for monitoring and managing the energy usage of the individual outlets in accordance with the illustrative embodiments. The process described in FIG. 4 may be implemented by power management system 130 in FIG. 1. The process begins with energy usage monitoring agents within the monitored facility monitoring and collecting current energy usage data about individual outlets in a facility (step 402). The power management system obtains current energy usage data from the monitoring agents periodically (e.g., at predetermined intervals) or on a continuous basis. Monitoring agents may utilize any known monitoring technology for measuring the electrical usage of an electrical device on an individual outlet basis.

At this point, the process may take one of two energy management paths. In the first path, the power management system analyzes the energy usage of the facility on an individual outlet basis (step 404). A determination is made by the power management system as to whether the electrical device connected to an individual outlet is currently active or in use (step 406). If the electrical device is active ('yes' output of step 406), the power management system determines if the energy usage of the individual outlet has met or exceeded an associated active threshold level for the outlet (step 407). If the active use threshold has been met or exceeded ('yes' output of step 407), the power management system makes a determination as to whether the policy associated with the exceeded threshold specifies that the outlet should be disabled (step 408). If the policy specifics that the outlet should be disabled ('yes' output of step 408), the power management system disables the outlet (step 410) and the process terminates thereafter. However, if the policy does not specify that the outlet should be disabled ('no' output of step 408), the power management system sends a notification to the consumer of the threshold event and/or logs the event in memory (step 412) and the process terminates thereafter.

Turning back to step 406, if the electrical device is not active or idle ('no' output of step 406), the power management system determines if the energy usage of the individual outlet has met or exceeded an associated passive threshold level for the outlet (step 414). If the passive use threshold as been met or exceeded ('yes' output of step 414), the process continues to step 408. If the passive use threshold has not been met or exceeded ('no' output of step 406), the process returns to step 404 to re-poll the energy usage for the outlet at a defined interval.

In the second path, the power management system analyzes the energy usage of the facility on an aggregate energy usage basis (step 416). A determination is made by the power management system as to whether the measured aggregate energy usage of the facility has met or exceeded a threshold level defined for the aggregate outlets (step 418). The aggregate threshold is a configurable threshold that defines the maximum acceptable level of energy usage for a defined group of outlets. If the aggregate threshold has been met or exceeded ('yes' output of step 418), the power management system identifies candidate outlets in the facility for disabling in order to reduce the energy consumption of the facility to fall below the aggregate threshold (step 420). The process continues to step 408 to determine if the policy associated with the aggregate threshold specifies that the selected candidate outlets may actually be disabled.

Turning back to step 418, if the active use aggregate threshold has not been met or exceeded ('no' output of step 418), the power management system identifies disabled candidate outlets in the facility for re-enabling (step 422), since the energy usage of the facility is below the acceptable energy threshold level. Upon identifying candidate outlets in the facility for enabling, the power management system enables the identified candidate outlets (step 424) and the process terminates thereafter.

Figure 5:
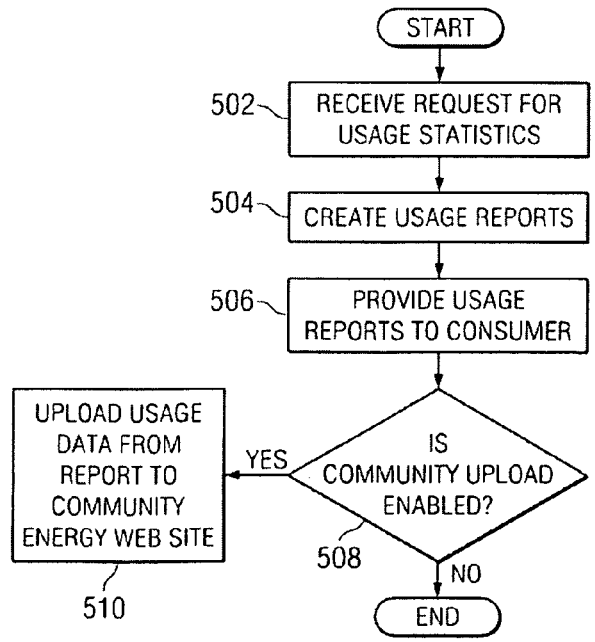
FIG. 5 is a flowchart of a process for obtaining historical energy usage data in an energy management environment in accordance with the illustrative embodiments.

FIG. 5 is a flowchart of a process for obtaining historical energy usage data in accordance with the illustrative embodiments. The process described in FIG. 5 may be implemented by power management system 130 in FIG. 1. The process begins with the power management system receiving a request for energy usage statistics from a consumer (step 502). Based on the consumer request, the power management system creates one or more reports indicating the energy usage of the facility on a per outlet basis, on an appliance basis, or by appliance category or type basis (step 504). The reports may include data indicating energy usage trends over time, such as, for example, by time of day or season. The energy usage trends in the reports inform a consumer as to if an energy conservation effort that was initiated has been successful at a facility level, at an appliance or outlet group level, and at an individual appliance or outlet level. The reports may also include reconciliation information that indicates which outlets are currently being monitored by the power manager and which outlets are not being monitored. The requested reports are then provided or displayed to the consumer (step 506).

The power management system may also optionally contribute the energy usage data collected in the report to the collective energy web site on web server 104 in FIG. 1. The power management system first makes a determination that the upload feature of the community web site is enabled (step 508). If the upload feature is not enabled ('no' output of step 508), the process terminates thereafter. However, if the upload feature is enabled ('yes' output of step 508), the power management system uploads the energy usage data from the report to the community web site at the web server (step 510). This energy usage data may be viewed and shared with other consumers in participating facilities through the web site.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode. etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for managing consumption of energy in a facility, the computer implemented method comprising:
    receiving a maximum amount of energy to use to power a plurality of electrical outlets in a facility for a predetermined period of time;
    collecting energy usage data for a first electrical outlet in the plurality of electrical outlets in the facility, wherein the first electrical outlet is connected to an unidentified electrical device;
    determining a pattern of energy usage from the energy usage data collected at the first electrical outlet;
    comparing the pattern of energy usage of the first electrical outlet against known patterns of energy usage for one or more other electrical outlets; and
    responsive to identifying a match between the pattern of energy usage of the energy usage data collected at the first electrical outlet and a known pattern of energy usage of a second electrical outlet in the one or more other electrical outlets, identifying the electrical device connected to the first electrical outlet as a same electrical device associated with the known pattern of energy usage of the second electrical outlet;
    determining whether the maximum amount of energy for the predetermined period of time has been delivered to the plurality of electrical outlets;
    responsive to a determination that the maximum amount of energy for the predetermined period of time has been delivered to the plurality of electrical outlets, disabling a set of the plurality of electrical outlets.

2. The computer implemented method of claim 1, further comprising:
    sending the current energy usage data and identification of the electrical device connected to the first electrical outlet to a community web site.

3. The computer implemented method of claim 2, wherein the known patterns of energy usage are obtained from at least one of energy usage data collected at electrical outlets in the facility, baseline energy usage profiles, or the community web site.

4. The computer implemented method of claim 2, wherein the energy usage data and identification of the electrical device connected to the first electrical outlet is automatically provided to the community web site on a one time basis or on a reoccurring basis.

5. The computer implemented method of claim 1, further comprising:
    creating an energy usage threshold for the first electrical outlet;
    responsive to a determination that the energy usage data of the first electrical outlet meets or exceeds the energy usage threshold, determining if the identified electrical device connected to the first electrical outlet is a critical device; and responsive to a determination that the identified electrical device is not a critical device, disabling the first electrical outlet.

6. The computer implemented method of claim 5, further comprising:

collecting updated energy usage data for the first electrical outlet; and responsive to a determination that the energy usage data of the first electrical outlet does not meet or exceed the energy usage threshold, enabling the first electrical outlet.

7. The computer implemented method of claim 5, wherein the energy usage threshold is one of a passive use threshold or an active use threshold.

8. The computer implemented method of claim 1, further comprising:

creating an aggregate energy usage threshold for a group of electrical outlets in the facility;

responsive to a determination that the aggregate energy usage data of the group of electrical outlets meets or exceeds the aggregate energy usage threshold, identifying target electrical outlets in the group of electrical outlets that are not connected to a critical device; and disabling the target electrical outlets.

9. The computer implemented method of claim 1, further comprising:

identifying electrical outlets in the facility for which energy usage data is not being collected;

generating a report comprising a list of the electrical outlets; and providing the report to a user.

10. The computer implemented method of claim 1, wherein the pattern of energy usage includes at least one of a quantity of energy usage, a rate at which energy is consumed by an electrical outlet, a length of time energy is consumed by the electrical outlet, or times of day energy is consumed by the electrical outlet.

11. The computer implemented method of claim 1, wherein the energy usage data and identification of the electrical device connected to the first electrical outlet provided to the community web site comprises at least one of energy usage data at an electrical outlet level, at an electrical device group level, or at a facility level.

12. The computer implemented method of claim 1, further comprising:

obtaining the known patterns of energy usage for one or more other electrical outlets in comparable facilities from the community web site;

comparing the known patterns of energy usage in the comparable facilities against the energy usage data collected at the facility;

generating a report comprising the comparison of the known patterns of energy usage for the comparable facilities and the energy usage data collected at the facility; and providing the report to a user.

13. The method of claim 1, and further comprising:

repeating the collecting step for the plurality of electrical outlets in the facility to form first aggregate energy usage data;

identifying second aggregate energy usage data for other facilities that have characteristics similar to the facility; and generating a report comparing the first aggregate energy usage data to the second aggregate energy usage data.

14. A data processing system for managing consumption of energy in a facility, the data processing system comprising:

a bus;

a storage device connected to the bus, wherein the storage device contains computer usable code;

at least one managed device connected to the bus;

a communications unit connected to the bus; and a processing unit connected to the bus, wherein the processing unit executes the computer usable code to receive a maximum amount of energy to use to power a plurality of electrical outlets in a facility for a predetermined period of time; collect energy usage data for a first electrical outlet in the plurality of electrical outlets in the facility, wherein the first electrical outlet is connected to an unidentified electrical device; determine a pattern of energy usage from the energy usage data collected at the first electrical outlet; compare the pattern of energy usage of the first electrical outlet against known patterns of energy usage for one or more other electrical outlets; responsive to identifying a match between the pattern of energy usage of the energy usage data collected at the first electrical outlet and a known pattern of energy usage of a second electrical outlet in the one or more other electrical outlets, identify the electrical device connected to the first electrical outlet as a same electrical device associated with the known pattern of energy usage of the second electrical outlet; determine whether the maximum amount of energy for the predetermined period of time has been delivered to the plurality of electrical outlets; and responsive to a determination that the maximum amount of energy for the predetermined period of time has been delivered to the plurality of electrical outlets, disable a set of the plurality of electrical outlets.

15. A computer program product for managing consumption of energy in a facility, the computer program product comprising:

a computer usable medium having computer usable program code tangibly embodied thereon, the computer usable program code comprising:

computer usable program code for receiving a maximum amount of energy to use to power a plurality of electrical outlets in a facility for a predetermined period of time;

computer usable program code for collecting energy usage data for a first electrical outlet in the plurality of electrical outlets in the facility, wherein the first electrical outlet is connected to an unidentified electrical device;

computer usable program code for determining a pattern of energy usage from the energy usage data collected at the first electrical outlet;

computer usable program code for comparing the pattern of energy usage of the first electrical outlet against known patterns of energy usage for one or more other electrical outlets; and computer usable program code for identifying, in response to identifying a match between the pattern of energy usage of the energy usage data collected at the first electrical outlet and a known pattern of energy usage of a second electrical outlet in the one or more other electrical outlets, the electrical device connected to the first electrical outlet as a same electrical device associated with the known pattern of energy usage of the second electrical outlet;

computer usable program code for determining whether the maximum amount of energy for the predetermined period of time has been delivered to the plurality of electrical outlets; and computer usable program code for, responsive to a determination that the maximum amount of energy for the predetermined period of time has been delivered to the plurality of electrical outlets, disabling a set of the plurality of electrical outlets.

16. The computer program product of claim 15, further comprising:

computer usable program code for sending the current energy usage data and identification of the electrical device connected to the first electrical outlet to a community web site.

17. The computer program product of claim 16, wherein the known patterns of energy usage are obtained from at least one of energy usage data collected at electrical outlets in the facility, baseline energy usage profiles, or the community web site.

18. The computer program product of claim 15, further comprising:

computer usable program code for creating an energy usage threshold for the first electrical outlet;

computer usable program code for determining, in response to a determination that the energy usage data of the first electrical outlet meets or exceeds the energy usage threshold, if the identified electrical device connected to the first electrical outlet is a critical device; and computer usable program code disabling the first electrical outlet in response to a determination that the identified electrical device is not a critical device.

19. The computer program product of claim 18, further comprising:

computer usable program code for collecting updated energy usage data for the first electrical outlet; and computer usable program code for enabling the first electrical outlet in response to a determination that the energy usage data of the first electrical outlet does not meet or exceed the energy usage threshold.

20. The computer program product of claim 15, further comprising:

computer usable program code for creating an aggregate energy usage threshold for a group of electrical outlets in the facility;

computer usable program code for identifying, in response to a determination that the aggregate energy usage data of the group of electrical outlets meets or exceeds the aggregate energy usage threshold, target electrical outlets in the group of electrical outlets that are not connected to a critical device; and computer usable program code for disabling the target electrical outlets.

* * * * *